United States Patent [19]

Sugino

[11] Patent Number: 5,662,814
[45] Date of Patent: Sep. 2, 1997

[54] MICRO-MACHINING MINUTE HOLLOW USING NATIVE OXIDE MEMBRANE

[75] Inventor: Rinji Sugino, Kawasaki, Japan

[73] Assignee: Fujitsu Limited, Kawasaki, Japan

[21] Appl. No.: 653,977

[22] Filed: May 28, 1996

Related U.S. Application Data

[63] Continuation of Ser. No. 304,779, Sep. 12, 1994.

[30] Foreign Application Priority Data

Dec. 27, 1993 [JP] Japan ..................................... 5-332727

[51] Int. Cl.$^6$ .................................................. C03C 25/06
[52] U.S. Cl. ................... 216/2; 216/39; 216/56; 216/60; 438/701; 438/708; 438/719
[58] Field of Search ........................... 216/2, 39, 60, 216/56, 80, 97; 437/919, 977; 204/129.3; 156/633.1, 646.1, 653.1, 657.1

[56] References Cited

U.S. PATENT DOCUMENTS

| | | | |
|---|---|---|---|
| 4,671,852 | 6/1987 | Pyke | 156/652.1 |
| 5,242,863 | 9/1993 | Xiang-Zheng et al. | 156/647 |
| 5,256,587 | 10/1993 | Jun et al. | 437/919 |
| 5,262,021 | 11/1993 | Lehmann et al. | 204/129.65 |
| 5,306,647 | 4/1994 | Lehmann et al. | 204/129.3 |
| 5,342,800 | 8/1994 | Jun | 437/977 |
| 5,358,888 | 10/1994 | Ahn et al. | 437/919 |
| 5,393,375 | 2/1995 | MacDonald et al. | 216/2 |

OTHER PUBLICATIONS

Journal Of Applied Physics, vol. 76, No. 9, Nov. 1, 1994, "Ultraviolet Excited Ci-Radial Etching of Si Through Native Oxides", pp. 5498–5502., Sugino et al.

Applied Physics Lett., vol. 61, No. 1., Jul. 6, 1992, "Non-uniformities of Native Oxides on Si (001) Surfaces formed During Wet Chemical Cleaning", pp. 102–104., Aoyama et al.

*Primary Examiner*—John Niebling
*Assistant Examiner*—Thomas G. Bilodeau
*Attorney, Agent, or Firm*—Nikaido, Marmelstein, Murray & Oram LLP

[57] ABSTRACT

A native oxide film is formed on the surface of a silicon substrate. The native oxide film has at least island-shaped imperfect $SiO_2$ regions not formed with a perfect $SiO_2$ film. Before the native oxide film is formed, a mask layer having a necessary opening is formed over the silicon substrate, according to necessity. The silicon substrate is etched in a vapor phase via the imperfect $SiO_2$ regions of the native oxide film to form a hollow under the native oxide film at least at a partial region thereof. An upper film is formed on the native oxide film to cover and close the imperfect $SiO_2$ regions. In this manner, a minute hollow can be formed in the silicon substrate with good controllability.

23 Claims, 12 Drawing Sheets

MICRO-MACHINING MINUTE HOLLOW USING NATIVE OXIDE MEMBRANE

This application is a continuation of application Ser. No. 08/304,779 filed Sep. 12, 1994.

BACKGROUND OF THE INVENTION

1. Field of the Invention

The present invention relates to a technique of forming a minute hollow in a semiconductor substrate, particularly in a silicon substrate.

A minute hollow formed in a silicon substrate can be used as a micro machine, a fine pressure gauge, a fine vacuum tube, and the like. A combination of a minute hollow forming technique and a semiconductor process technique of forming an integrated circuit on a silicon substrate allows both an electronic circuit and a minute hollow to be formed on the same substrate, and provides a variety of applications.

2. Description of the Related Art

Conventional techniques of working a silicon substrate are, for example, anisotropic etching such as reactive ion etching (RIE) which etches a substrate surface only in a vertical direction, and such anisotropic etching as etching a substrate surface by KOH aqueous solution or the like at an etching rate which changes with a Miller index of a crystal plane.

SUMMARY OF THE INVENTION

Although silicon substrate working technique, particularly fine pattern working techniques, have advanced significantly, an advent of new working technique has been desired which expands application fields of silicon substrates.

It is an object of the present invention to provide a technique of forming a minute hollow in a silicon substrate with high controllability.

According to one aspect of the present invention, a method of forming a minute hollow is provided. The method includes the steps of: (a) forming a porous film having a number of fine holes at least on a partial area of the surface of a substrate; (b) etching the substrate via the fine holes in at least a partial region of the porous film to form a hollow under at least the partial region of the porous film; and (c) forming an upper layer at least on the porous film to cover the fine holes.

The substrate may be a silicon substrate, and the porous film may be a native oxide film having at least island-shaped imperfect $SiO_2$ regions not formed with a perfect $SiO_2$ film such as a thermally oxidized film or a chemical-vapor-deposited (CVD) film.

The method may include before the step (a) the steps of: (d) forming an underlying thin film having a predetermined thickness on the surface of the silicon substrate; and (e) forming an opening in the underlying thin film at a region corresponding to at least the partial region to expose the surface of the silicon substrate, wherein the step (a) may form the native oxide film on the surface of the silicon substrate exposed at the bottom of the opening.

According to another aspect of the present invention, there is provided a micro device with a minute hollow which includes: an underlying substrate having a concave formed in the surface of the substrate at a predetermined region; and a lid member covering an opening of the concave, the lid member including a porous film having a number of fine holes formed at least at a partial region thereof and an upper film formed on the porous film.

According to a further aspect of the present invention, there is provided a method of forming a minute hollow including the steps of: (a) forming a convex region of a predetermined pattern on an underlying substrate having a surface resistant to etching, the convex region having a side wall generally perpendicular to the surface of the underlying substrate; (b) forming a side wall protection film resistant to etching on the side wall of the convex region; (c) forming a porous film having a number of fine holes on the upper surface of the convex region; (d) removing at least a partial region of the convex region via the fine holes; and (e) forming an upper film at least on the porous film to cover the fine holes.

The convex region may be made of polysilicon, the porous film may be a native oxide film having at least island-shaped imperfect $SiO_2$ regions not formed with a perfect $SiO_2$ film, and the step (d) may remove at least a partial region of the convex region by etching the convex region made of polysilicon.

According to another aspect of the present invention, there is provided a micro device with a minute hollow including: an underlying substrate having a surface resistant to etching; a hollow member formed on the underlying substrate and containing a hollow therein, the hollow being covered with a porous film having a number of fine holes formed at least in a partial region thereof; and a cover film formed at least on the porous film to cover the fine holes.

A silicon substrate is etched in a vapor phase through a native oxide film formed on the substrate surface and having at least island-shaped imperfect $SiO_2$ regions not formed with a perfect $SiO_2$ film. A hollow is therefore formed under the native oxide film which is left on the substrate surface. Etchant gas passes through the imperfect $SiO_2$ regions of the native oxide film, and etches the silicon substrate both in the vertical and lateral directions. The native oxide film is left on the substrate surface, like a lid of the hollow.

As a thin film is deposited on the native oxide film, it is also deposited on the inner surface of the hollow via the imperfect $SiO_2$ regions at the initial stage. However, the thin film deposited on the native oxide film grows also in the lateral direction and eventually closes fine holes of the imperfect $SiO_2$ regions. After the fine holes are closed with the thin film, the thin film is not deposited on the inner surface of the hollow. In this manner, the hollow covered with the thin film lid can be formed.

A hollow surrounded by a side wall protection film may be formed by forming a polysilicon region of a predetermined pattern on an underlying substrate having a surface resistant to etching, covering the side wall of the polysilicon region with a side wall protection film resistant to etching, forming a native oxide film on the top surface of the polysilicon region, and etching the polysilicon region under the native oxide film.

Instead of a native oxide film, a porous film having the same property as the native oxide film may be used. Etching may be performed in a liquid phase as well as in a vapor phase. Material to be etched is not limited to only silicon.

In the manner described above, a minute hollow can be formed in a silicon substrate or in other substrates such as a glass substrate.

DETAILED DESCRIPTION OF THE PREFERRED EMBODIMENTS

The first embodiment of the invention will be described with reference to FIGS. 1A to 1E.

Figure 1A:
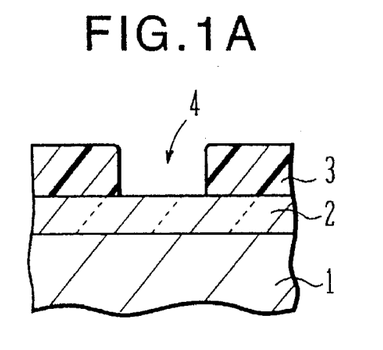
FIGS. 1A to 1E are cross sectional views of a substrate explaining a method of forming a minute hollow according to a first embodiment of the invention.

As shown in FIG. 1A, an $SiO_2$ film 2 is formed on the surface of a silicon substrate 1 to a thickness of about 300 nm in a dry oxygen atmosphere at 1000° C. A photo-resist film 3 is coated on the surface of the $SiO_2$ film 2. A predetermined opening 4 is formed in the resist film 3 by photolithography.

Figure 1B:
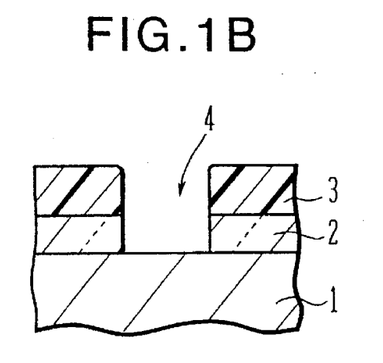

As shown in FIG. 1B, by using the resist film 3 as a mask, the $SiO_2$ film 2 is selectively etched by reactive ion etching (RIE) to expose the surface of the silicon substrate 1 at the bottom of the opening 4.

Figure 1C:
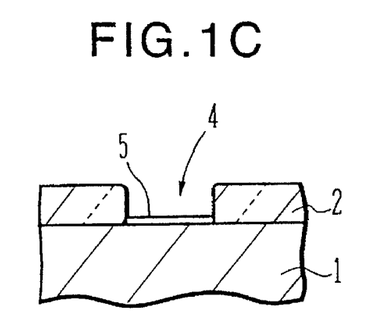

As shown in FIG. 1C, the resist film 3 is removed and the substrate is treated in an ammonium-hydrogen peroxide solution and nitric acid. A native oxide film 5 is therefore formed on the exposed surface of the silicon substrate 1. The thickness of the native oxide film 8 measured by XPS (X-ray photoelectron spectroscopy) was about 0.8 to 1.0 nm.

A native oxide film may be formed by exposing a silicon surface in atmospheric air, by processing it with concentrated sulfuric acid, concentrated nitric acid, hydrogen peroxide, a mixed solution of hydrogen peroxide and acid or ammonium, or a mixed solution of such chemical agent and pure water, or by immersing it in pure water for a long time. A native oxide film may be formed by immersing a silicon surface in pure water containing oxygen for about ten minutes, or exposing it in oxidizing gas or vapor such as oxygen and ozone at a temperature from room temperature to 750° C.

The oxide film formed in the above manner is an imperfect $SiO_2$ film either having minute island-shaped exposed surfaces of the: silicon substrate or having minute island-shaped dense areas of Si—Si bonds or Si-H bonds. In this specification, such imperfect oxide films other than a thermal oxide film formed at 800° C. or higher or an oxide film deposited on a surface by CVD (chemical vapor deposition) are called a native oxide film.

Figure 1D:
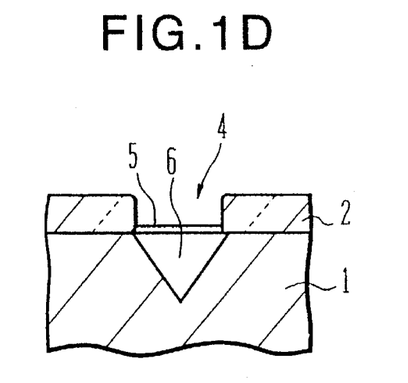

As shown in FIG. 1D, The silicon substrate 1 is etched in a chlorine atmosphere at a pressure of 20 Torr, at a temperature of 450° C., and for 15 minutes, while applying ultraviolet light at an intensity of 20 $mW/cm^2$. Chlorine etches only the silicon substrate and does not etch $SiO_2$. Therefore, etching starts from the minute island-shaped imperfect areas of the native oxide film 5 and the silicon substrate 1 under the native oxide film 5 is under-etched.

A hollow 6 is therefore formed under the opening 4, the follow 6 is covered with the native oxide film 5 having a number of island-shaped fine holes. Chlorine scarcely etches the (1 1 1) plane of silicon single crystal so that the (1 1 1) plane is exposed in the hollow 6. For example, a silicon substrate having the (1 0 0) plane has a hollow 8 of a quadrangular pyramid shape.

If an opening 4 having a longer side is to be formed at the process illustrated in FIG. 1B, the width is preferably 2 μm or less from the viewpoint of a mechanical strength of the native oxide film 5, or the size of the opening 4 is preferably smaller than a circle having a diameter of about 3 μm.

Figure 1E:
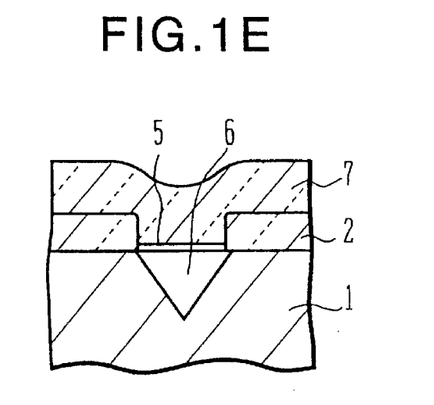

As shown in FIG. 1E, an $SiO_2$ film 7 is deposited on the substrate surface to a thickness of 200 nm by CVD. During the deposition of the $SiO_2$ film 7, source molecules enter the hollow 6 via the holes in the native oxide film 5. An $SiO_2$ film is therefore deposited also on the inner surface of the hollow 6 as well as on the native oxide film 5. As the $SiO_2$ film is deposited on the native oxide film 5, it also grows in the lateral direction on the native oxide film 5 and closes the holes. In depositing the $SiO_2$ film, sputtering, vapor deposition, or the like may be used.

After the holes in the native oxide film 5 are closed with the $SiO_2$ film, an $SiO_2$ film does not grow on the inner surface of the hollow 8 which is sealed by the $SiO_2$ film 7.

In this embodiment, an $SiO_2$ film is used as the mask when the silicon substrate 1 is etched by chlorine. Any other film not etched by chlorine may be used as the mask.

Any gas other than chlorine, such as HCl, $Br_2$, and HBr may be used as silicon etchant so long as it does not etch $SiO_2$ and etches silicon.

The second embodiment of the invention will be described with reference to FIGS. 2A and 2B.

Figure 2A:
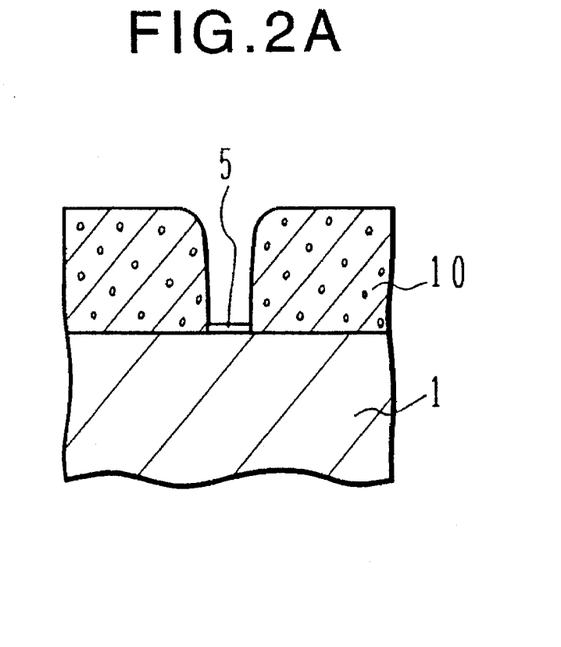
FIGS. 2A and 2B are cross sectional views of a substrate explaining a method of forming a minute hollow according to a second embodiment of the invention.

As shown in FIG. 2A, a polysilicon layer 10 is deposited on the surface of a silicon substrate 1 to a thickness of 500 nm by CVD. By the processes similar to those illustrated in FIGS. 1A to 1C, the polysilicon layer 10 is selectively etched to have a predetermined pattern, and a native oxide film 5 is formed on the exposed surface of the silicon substrate 1.

Figure 2B:
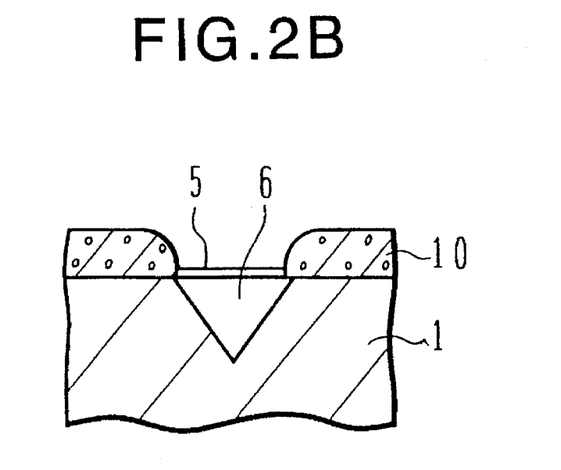

As shown in FIG. 2B, the silicon substrate is etched in a chlorine atmosphere for one minute. With this one minute etching, the polysilicon layer 10 is not completely etched but a portion thereof is left unetched. A hollow 6 is formed under the native oxide film 5 by the similar process illustrated in FIG. 1D.

As described above, a mask for etching a silicon substrate may be made of material which can be etched by chlorine, if it has a sufficient thickness.

The third embodiment of the invention will be described with reference to FIGS. 3A to 3C.

Figure 3A:
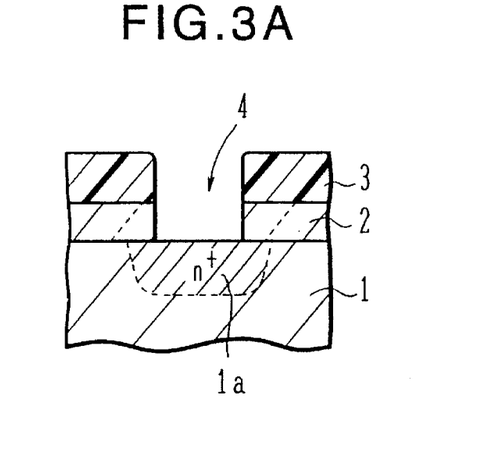
FIGS. 3A to 3C are cross sectional views of a substrate explaining a method of forming a minute hollow according to a third embodiment of the invention.

As shown in FIG. 3A, an $SiO_2$ film 2 and a resist film 3 having an opening 4 is formed on the surface of a silicon substrate 1, by the similar processes illustrated in FIGS. 1A and 1B. By using the resist film 3 and $SiO_2$ film 2 as a mask, impurity ions of group V such as phosphorus and arsenic are implanted into the silicon substrate 1 to form an $n^+$-type region 1a. The $n^+$-type region may be formed by thermal diffusion by using the $SiO_2$ film 2 as a mask. As shown in FIG. 3B, the resist film 3 is removed, and a native oxide film 5 is formed by the similar processes illustrated in FIGS. 1C and 1D. Reaction of chlorine with $n^+$-type silicon is good and an etching rate of the $n^+$-type region is high. By using this etching rate difference, only the $n^+$-type region 1a can be etched substantially.

Figure 3B:
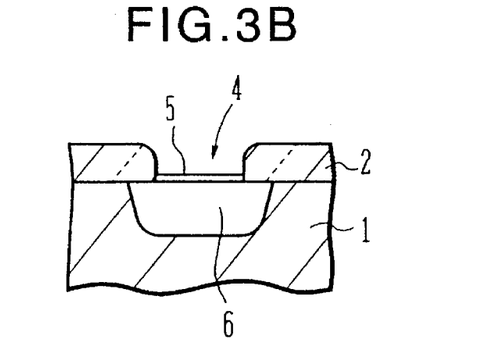
Figure 3C:
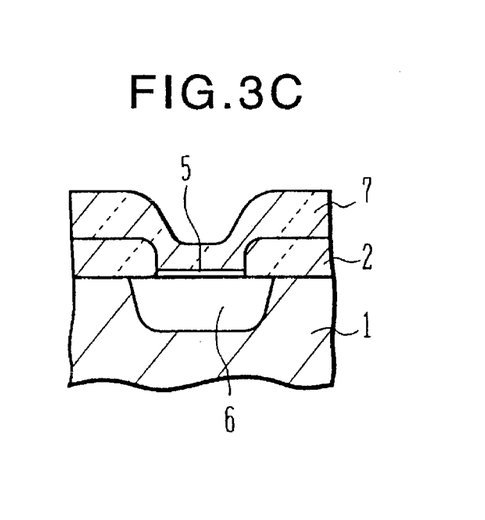

As shown in FIG. 3C, an $SiO_2$ film 7 is deposited on the silicon substrate by the similar process illustrated in FIG. 1E. In the above manner, a hollow 6 is formed at the $n^+$-type region.

In the third embodiment, the same $SiO_2$ film 2 is used as the mask of forming the $n^+$-type region 1a and as the mask of etching the silicon substrate 1. Different masks may be used. For example, before the $SiO_2$ film 2 is formed, another $SiO_2$ film may be formed which is used as the mask of forming an $n^+$-type region 1a at a predetermined area of the silicon substrate 1. After the $SiO_2$ film for forming the $n^+$-type region is removed, another $SiO_2$ film 2 may be formed and the processes illustrated in FIGS. 3A to 3C may be performed.

If the same mask is used for both forming the $n^+$-type region 1a and etching the silicon substrate, it is difficult to form a hollow having a width of about 2 μm or more because of a mechanical strength of the native oxide film 5. However, using different masks allows the width of the $n^+$-type region 1a to be 2 μm or more.

While the $n^+$-type region 1a is etched via. the holes in the native oxide film 5 at the process illustrated in FIG. 3B, the etch progresses also in the lateral direction. Therefore, even if the width of the native oxide film 5 is 2 μm or less, a hollow having a width of 2 μm or more can be formed if a large $n^+$-type region 1a is formed. In this case, the portion of the hollow 6 near the opening is covered with the $SiO_2$ film thicker than the native oxide film 5, so that a sufficient mechanical strength can be retained.

The fourth embodiment of the invention will be described with reference to FIGS. 4A and 4B.

Figure 4A:
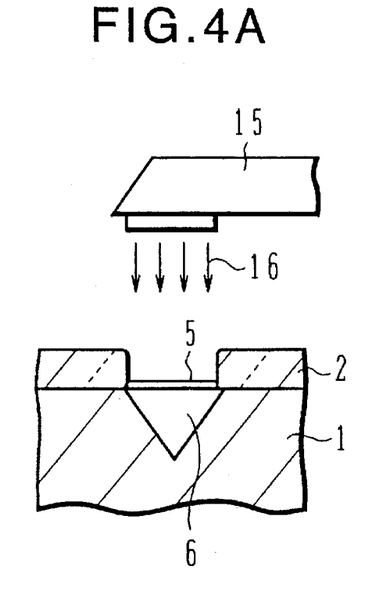
FIGS. 4A and 4B are cross sectional views of a substrate and schematic side views of an ultraviolet light source and a plasma source, explaining a method of forming a minute hollow according to a fourth embodiment of the invention.

As shown in FIG. 4A, when a silicon substrate 1 is etched by the similar process illustrated in FIG. 1D, ultraviolet light 16 having a wavelength of 250 nm to 450 nm is applied from an ultraviolet light source 15 to the surface of the silicon substrate 1. Chlorine molecules are excited by the ultraviolet light having a wavelength of 250 nm to 450 nm, and chlorine radicals are generated. With the help of the chlorine radicals, the etching speed for the silicon substrate 12 is raised. By controlling the intensity of ultraviolet light, the controllability of the etching speed is improved. Wavelength change of an irradiating UV light may also be employed.

Figure 4B:
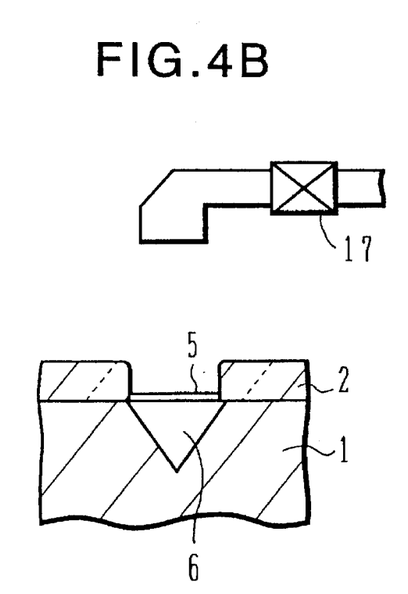

As shown in FIG. 4B, active chlorine may be generated by a microwave excited plasma in a plasma generator 17 to etch a silicon substrate 1 by plasma down-flow. A microwave of 2.45 GHz may be used. With plasma down-flow, it becomes possible to etch a silicon substrate by using neutral active species having substantially no high energy charged-particles (or ions).

The fifth embodiment of the invention will be described with reference to FIGS. 5A and 5B.

Figure 5A:
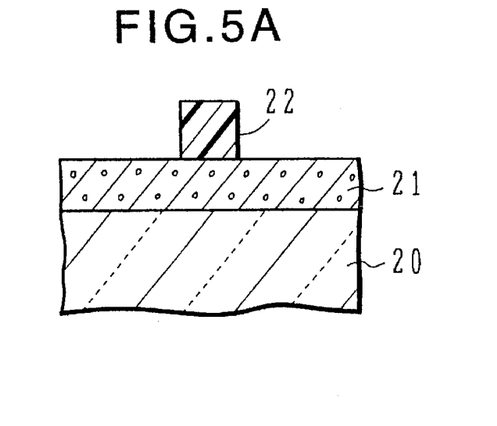
FIGS. 5A to 5E are cross sectional views of a substrate explaining a method of forming a minute hollow according to a fifth embodiment of the invention.

As shown in FIG. 5A, a polysilicon layer 21 is formed on a glass substrate 20 to a thickness of about 500 nm. A photo-resist film 22 is coated on the surface of the polysilicon layer 21, and a predetermined resist film pattern is formed by photolithography.

Figure 5B:
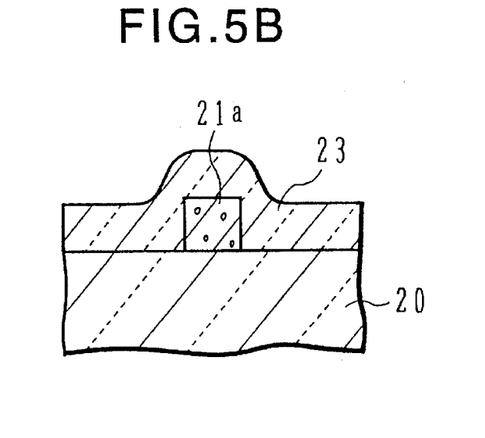

As shown in FIG. 5B, by using the resist film 22 as a mask, the polysilicon layer 21 is etched to form a polysilicon region 21a having a predetermined pattern. After the resist film 22 is removed, an $SiO_2$ film 23 is formed by CVD to a thickness same as, or greater than, that of the polysilicon layer 21. A film is generally isotropically grown by CVD. Therefore, the $SiO_2$ film 23 grows also on the side wall of the polysilicon region 21a.

Figure 5C:
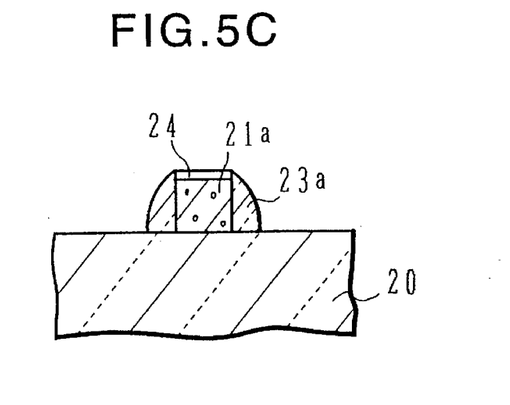

As shown in FIG. 5C, the $SiO_2$ film 23 is anisotropically etched by the amount corresponding to the thickness of the deposited film, by RIE. RIE etches the $SiO_2$ film only in the direction perpendicular to the substrate surface. Therefore, a side wall protection film 23a of $SiO_2$ is left on the side wall of the polysilicon region 21a.

Next, a native oxide film 24 is formed on the surface of the polysilicon region 21a by the similar process illustrated in FIG. 1C. The surface of the polysilicon region 21a has been damaged by RIE. For eliminating the damaged region, the surface of the polysilicon region 21a may be lightly oxidized, and thereafter the thin oxide film is etched by etchant containing hydrofluoric acid, before the native oxide film 24 is formed. Alternatively, the surface of the polysilicon region 21a may be lightly etched by an etching method which does not damage the region 21a.

Figure 5D:
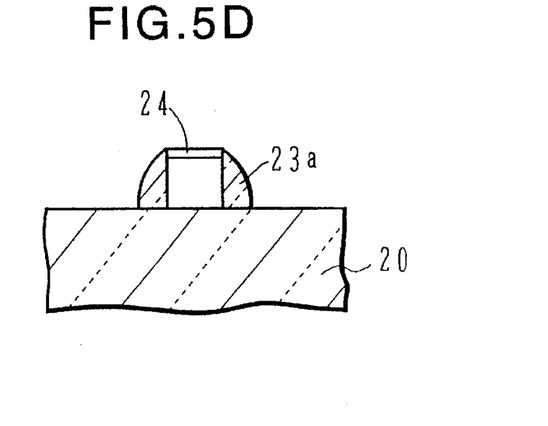

As shown in FIG. 5D, the polysilicon region 21a is etched via the native oxide film 24 in a chlorine atmosphere by the similar process illustrated in FIG. 1D. The native oxide film 24 is supported by the side wall protection film 23a and retains the initial position.

Figure 5E:
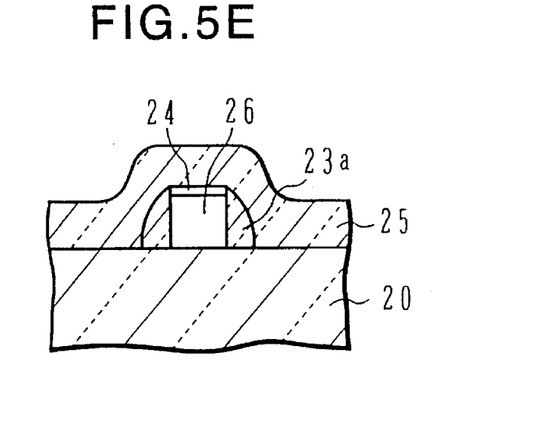

As shown in FIG. 5E, an $SiO_2$ film 25 is deposited on the substrate by CVD. The $SiO_2$ film 25 deposited on the native oxide film 24 closes fine holes in the native oxide film 24. A hollow 26 is therefore formed which is surrounded by the glass substrate 20, side wall protection film 23a, native oxide film 24, and $SiO_2$ film 25.

The substrate 20 is not necessarily a glass substrate, but any other material may be used unless it is etched or damaged by chlorine. A different film from the $SiO_2$ film 25 may be used if it can be deposited on the native oxide film. For example, a polysilicon film or the like may be used.

By supporting a native oxide film by a side wall protection film such as $SiO_2$, a minute hollow can be formed on the surface of a glass substrate or the like other than a silicon substrate.

Figure 6:
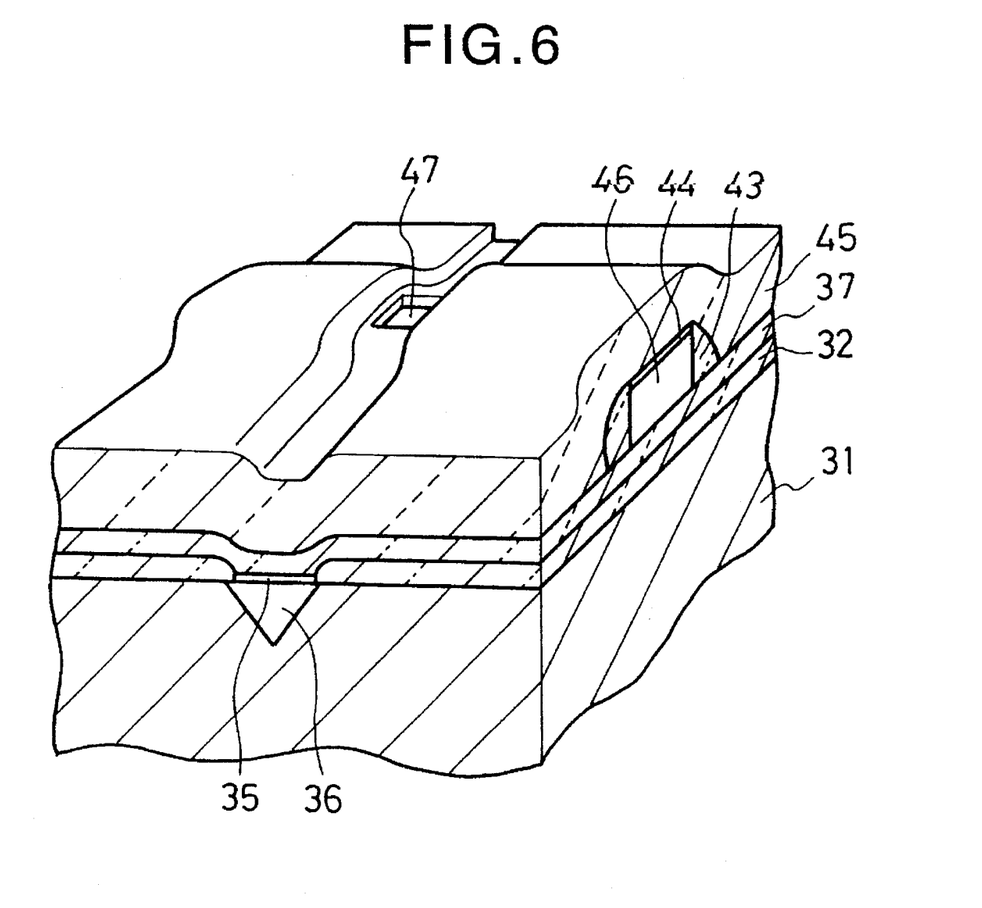
FIG. 6 is a perspective view of a substrate having a minute hollow formed by the sixth embodiment method.

The sixth embodiment of the invention will be described with reference to FIG. 6.

A lower hollow groove 36 of a V-shape is formed in the surface of a silicon substrate 31, by the method similar to the first embodiment illustrated in FIGS. 1A to 1E. The surface of the silicon substrate 31 excepting the lower hollow groove 36 is being covered with an $SiO_2$ film 32. A native oxide film 35 is being left over the lower hollow groove 36. The native oxide film 35 and $SiO_2$ film 32 are being covered with another SiO2 film 37.

Next, an upper hollow groove 46 is formed on the $SiO_2$ film 37 by the method similar to the fifth embodiment illustrated in FIGS. 5A to 5E, the upper hollow groove 46 being surrounded by a side wall protection film 43 and a native oxide film 44 and crossing the lower hollow groove 36. The substrate surface including the upper hollow groove is being covered with, for example, an $SiO_2$ film 45. A plurality of hollow grooves crossing each other may be formed in the above manner.

The two hollow grooves 36 and 46 may be coupled together by forming a junction hole 47 passing through the surface SiO$_2$ film 45 and native oxide film 46 into the SiO$_2$ film 37 and native oxide film 35 at the cross position of the two hollow grooves.

The seventh embodiment of the invention will be described with reference to FIGS. 7A and 7B.

Figure 7A:
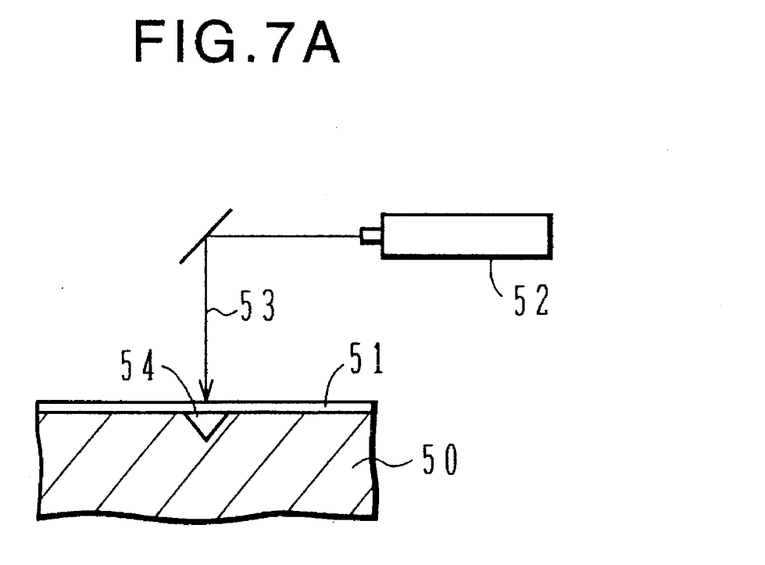
FIGS. 7A and 7B are cross sectional views of a substrate explaining a method of forming a minute hollow according to a seventh embodiment of the invention.

As shown in FIG. 7A, a silicon substrate 50 with a native oxide film 51 formed on the surface thereof is prepared. The native oxide film 51 is an imperfect native oxide film having minute island-shaped fine holes therein. The silicon substrate 50 is placed in a chlorine atmosphere and a laser beam 53 is applied to the substrate surface at a predetermined area. Chlorine radicals are generated at the area where the laser beam is applied, and the silicon substrate 50 is etched at this area. By properly selecting the process conditions, the etch is controlled to hardly progress at the area where the laser beam is not applied.

As a laser source 52 of the laser beam 53, argon laser, He-Ne laser, excimer laser, or the like may be used which can activate the silicon surface or generate chlorine radicals. The intensity of a laser beam is preferably 1 W/μm$^2$ or less in order to prevent the decomposition or evaporation of the native oxide film 51.

Figure 7B:
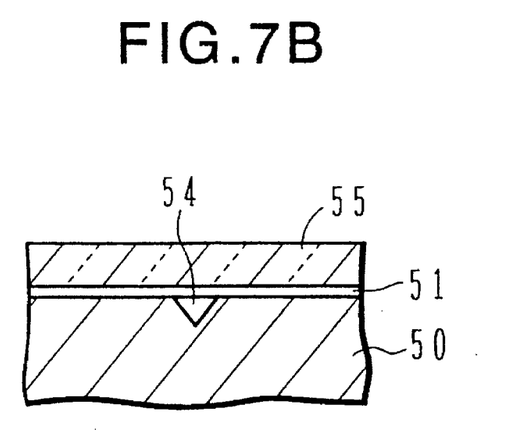

As shown in FIG. 7B, an SiO$_2$ film 55 is deposited on the native oxide film 51 by CVD or the like. In the above manner, without using an etching mask of protecting the silicon substrate 50, a hollow 54 is formed only at the area where the laser beam 53 is applied. A hollow having a desired pattern may be formed by scanning the laser beam.

Figure 8A:
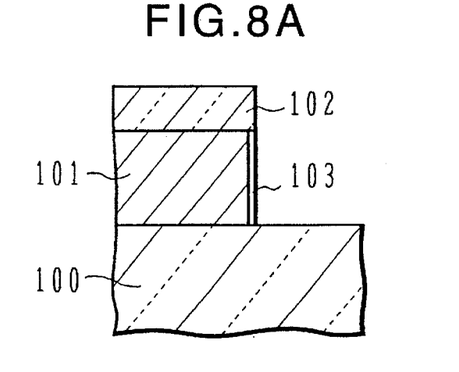
FIGS. 8A to 8C are cross sectional views of a substrate explaining a method of forming a minute hollow according to an eighth embodiment of the invention.
Figure 8B:
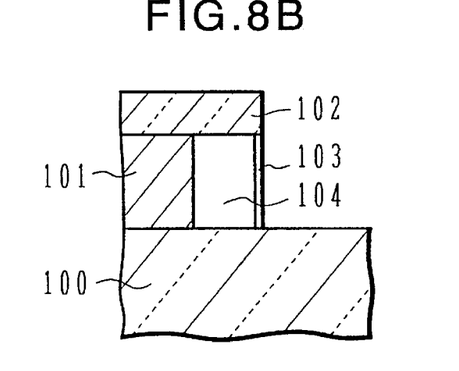

The eighth embodiment of the invention will be described with reference to FIGS. 5A to 8C.

As shown in FIG. 5A, a polysilicon layer 101 is deposited on a thermal oxide film 100 by CVD or the like. The surface of the polysilicon layer 101 is thermally oxidized to form an SiO$_2$ film 102. A resist film with a predetermined pattern is formed on the SiO$_2$ film 102. The SiO$_2$ film 102 is selectively etched by RIE or the like. Next, the polysilicon layer 101 is selectively etched by RIE or the like to expose side walls thereof.

A native oxide film 103 is formed on the exposed side walls of the polysilicon layer 101 by the similar process as illustrated in FIG. 1C.

As shown in FIG. 8B, the polysilicon layer 101 is etched to a predetermined depth via the native oxide film 103 by the similar process illustrated in FIG. 1D. The native oxide film 103 remains at the initial position because the upper side thereof is supported by the SiO$_2$ film 102.

If the side walls of the polysilicon layer 101 in parallel to the drawing sheet are covered by the native oxide film 103, a hollow 104 is formed which is surrounded by the SiO$_2$ film 102 at the top, by the SiO$_2$ film 100 at the bottom, and by the polysilicon layer 101 and native oxide film 103 at the side walls. If the circumferential side wall of the polysilicon layer 101 is fully exposed, a ring hollow 104 is formed which surrounds the polysilicon layer 101.

Figure 8C:
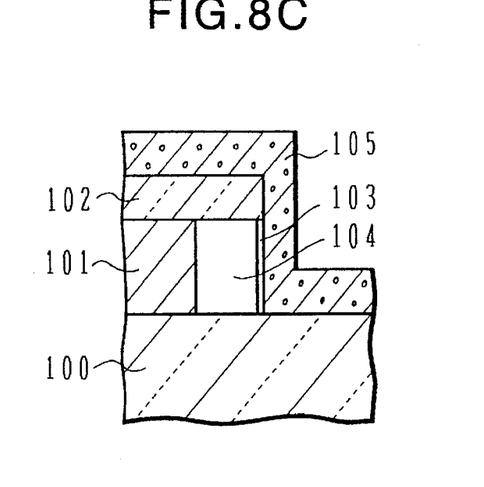

As shown in FIG. 8C, a polysilicon layer 105 is deposited over the substrate surface by CVD or the like. The polysilicon layer 105 is generally isotropically deposited so that it is deposited also on the side wall of the native oxide film 103. In this manner, the hollow 104 is sealed.

Next, examples of applications of a minute hollow formed in the substrate to a micro device will be described.

Figure 9:
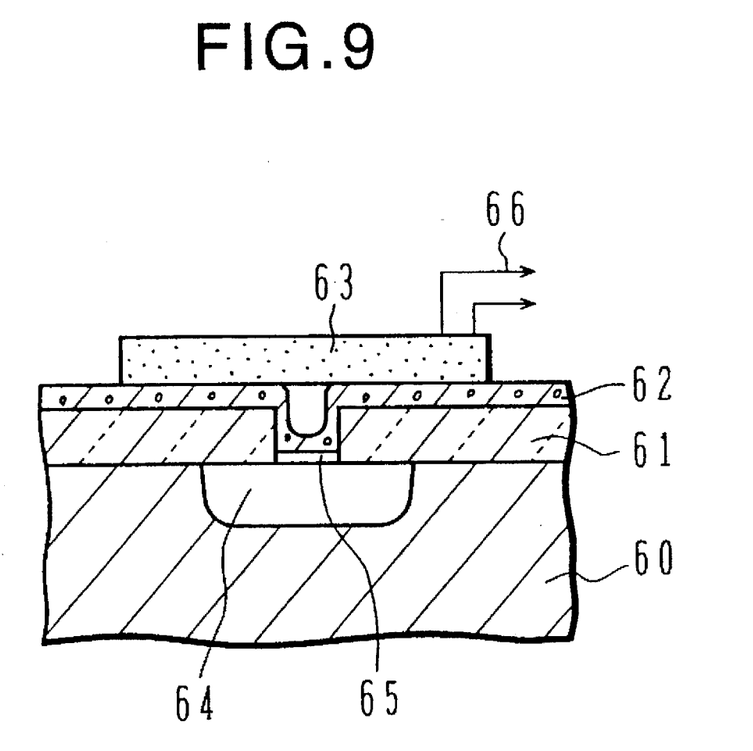
FIG. 9 is a cross sectional view of a minute pressure gauge using a minute hollow formed by the embodiment method.

FIG. 9 shows a micro pressure gauge using a minute hollow formed in a substrate.

A hollow 64 is being formed in a silicon substrate 60 by the similar method to the third embodiment shown in FIGS. 3A to 3C. An SiO$_2$ film 61 having an opening at the position corresponding to the hollow 64 is being formed on the silicon substrate 60. A native oxide film 65 is being formed at the opening of the SiO$_2$ film 61. A polysilicon film 62 is being formed on the SiO$_2$ film 61 and native oxide film 65. A thin film piezoelectric body 63 is attached to the polysilicon film 62 at the area corresponding to the hollow 64. Electrodes (not shown) are connected to the piezoelectric body 63, and lead wires 66 are connected to the electrodes.

It is preferable to deposit the polysilicon film 82 by using inert gas atmosphere such as argon. Inert gas is hermetically filled in the hollow 64.

If there is a difference between the inner pressure of the hollow 64 and an external pressure, the piezoelectric body 63 generates a strain corresponding to the pressure difference. This strain generates a voltage between the electrodes of the piezoelectric body 63. The external pressure can be calculated from the detected voltage. A micro pressure gauge of about several μm square can be formed in the above manner.

Figure 10:
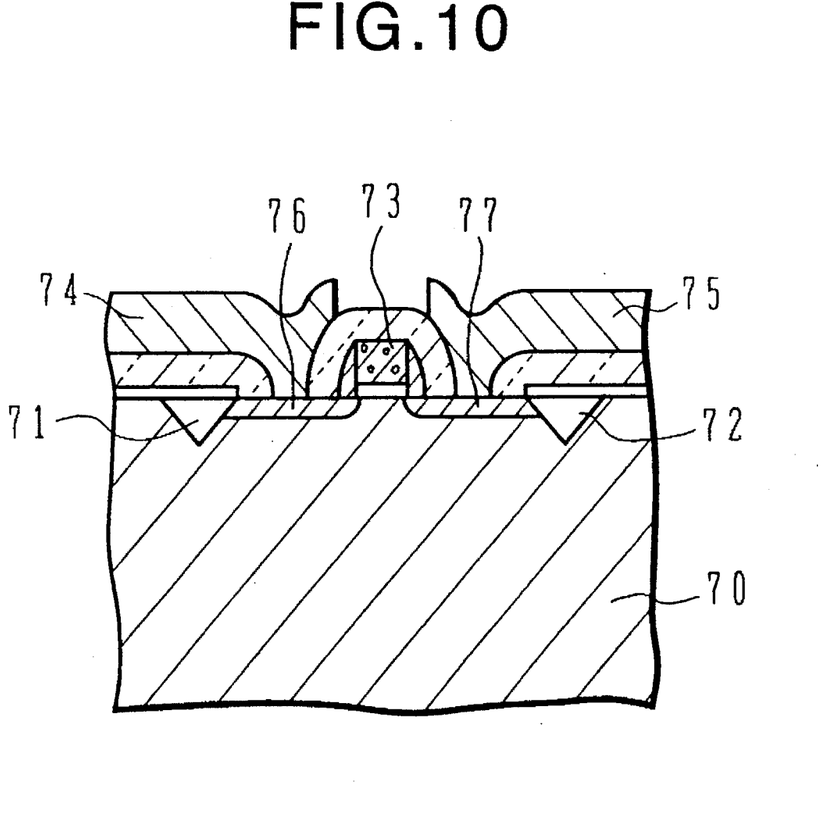
FIG. 10 is a cross sectional view of a substrate with semiconductor elements isolated by a minute hollow formed by the embodiment method.

FIG. 10 illustrates gas isolation of semiconductor elements by micro hollows formed in a silicon substrate.

Micro hollows 71 and 72 are being formed in the surface of a silicon substrate 70, being spaced apart by a predetermined distance. Formed on the surface of the silicon substrate 70 between the minute hollows 71 and 72 are, for example, a source region 76, a drain region 77, and a gate electrode 73 of an insulating gate structure. Source and drain electrodes 74 and 75 are being formed in ohmic contact with the source and drain regions 76 and 77.

The region between the hollows 71 and 72 can be separated and electrically isolated from other regions. This method can provide a silicon device having a small parasitic capacitance and a small strain, as compared to LOCOS or a V-shaped groove filled with SiO$_2$.

FIGS. 11A to 11E illustrate a method of forming a vacuum tube in a minute hollow formed in a silicon substrate.

Figure 11A:
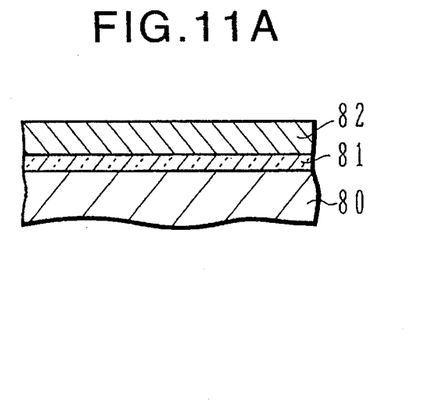
FIGS. 11A to 11D are cross sectional views of a substrate explaining a method of forming a minute vacuum tube by using a minute hollow formed by the embodiment method.

As shown in FIG. 11A, an SiO$_2$ film 81 is formed on an n$^+$-type silicon substrate 80 by CVD or the like. A metal film 82 resistant to chlorine etch, such as tungsten, titanium, and nickel is vapor-deposited on the SiO$_2$ film 81.

Figure 11B:
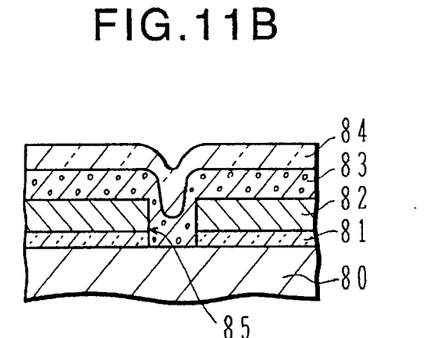

As shown in FIG. 11B, an opening 85 of a predetermined shape is formed in the SiO$_2$ film 81 and metal film 82. As will be later described, the metal film 82 is patterned to have electrodes of a predetermined shape, and the opening 85 having a shape corresponding to a desired hollow is formed in the SiO$_2$ film 81. A polysilicon film 83 is deposited over the substrate surface to fill the opening 85 with it. An SiO$_2$ film is formed on the polysilicon film 83. The polysilicon film 83 is deposited immediately after the opening 85 has been formed, in order not to form a native oxide film on the exposed surface of the silicon substrate 80.

Figure 11C:
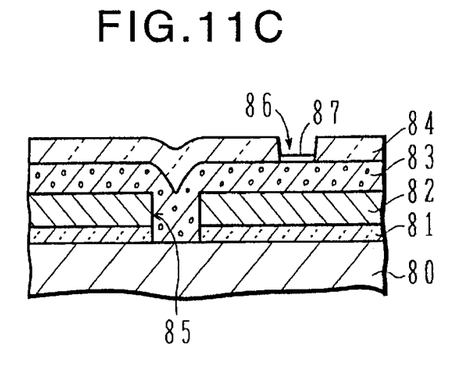

As shown in FIG. 11C, an opening 86 is formed in the SiO$_2$ film 84 at the position slightly deviated from the opening 85. A native oxide film 87 is formed on the surface of the polysilicon film 83 exposed at the bottom of the opening 86.

Figure 11D:
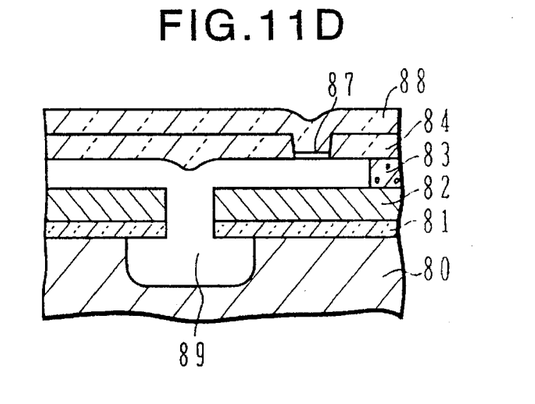

As shown in FIG. 11D, the polysilicon film 83 is etched via the native oxide film 87 in a chlorine atmosphere. Since the metal film 82 is not etched by chlorine, the etch progresses mainly in the lateral direction and reaches the opening 85. After the polysilicon film 83 has been etched to the bottom of the opening 85, the n$^+$-type silicon substrate 80 is etched and a hollow 89 is formed. Because of the n⁺-type substrate, the etch progresses also in the lateral direction to form the hollow 89.

Figure 11E:
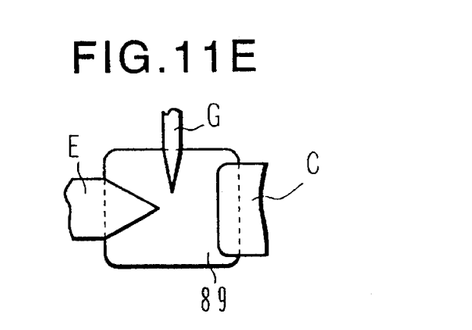
FIG. 11E is a plan view of electrodes.

After the silicon substrate 80 has been etched to form the hollow 89 having a predetermined dimension, an $SiO_2$ film 88 is deposited over the substrate surface by CVD or the like. For reliable etching of a predetermined region of the polysilicon film 83, the region may be changed to an n⁺-type region, for example, by ion implantation into the deposited polysilicon film FIG. 11E is a plan view of the hollow 89 region with the $SiO_2$ films 84 and 88 being removed. An emitter electrode E and a collector electrode C made of the metal film 82 project into the hollow 89 from opposite sides thereof. A base electrode B made of the metal film 82 projects into the hollow 89 from another side thereof, its tip being positioned near at the tips of the emitter electrode E and collector electrode C.

In the above manner, a micro triode vacuum tube having the emitter, collector, and grid electrodes E, C, and G projecting to the minute hollow 89 can be formed. The reason why the opening 87 is slightly deviated from the opening 85 is that it is necessary for the $SiO_2$ film 88 to be prevented from being deposited via fine holes in the native oxide film 87 onto the tips of the electrodes.

Figure 12:
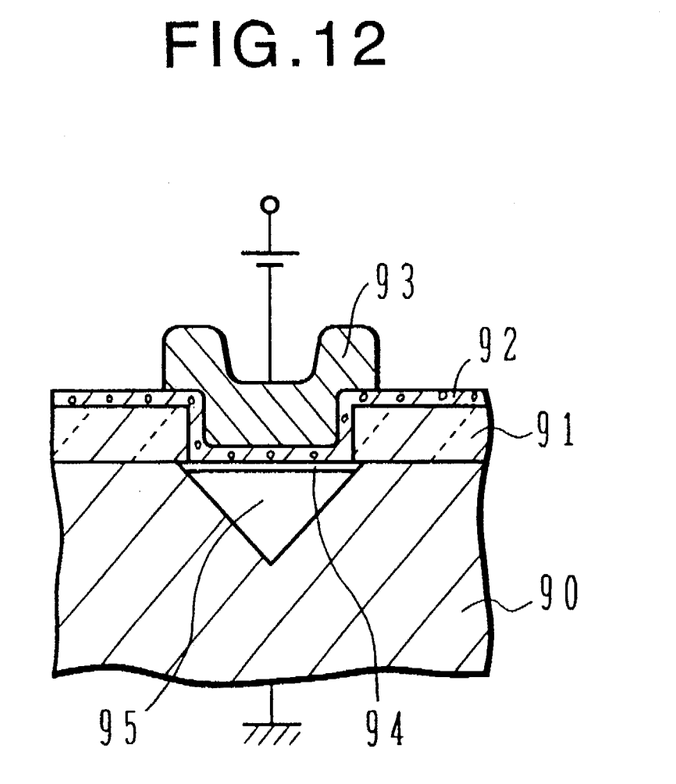
FIG. 12 is a cross sectional view of a substrate explaining a method of detecting $D_2$/Pt-based excess heat by using a minute hollow formed by the embodiment method.

FIG. 12 shows the structure of a device for detecting D (deuterium)/Pt(platinum)—based excess heat.

By a method similar to the first embodiment, a hollow 95 is formed in a silicon substrate 90 by using an $SiO_2$ film 91 and a native oxide film 94. A polysilicon film 92 is deposited on the native oxide film 94 and $SiO_2$ film 91, by CVD using a mixed gas of $SiD_4$ and $D_2$. By using $SiD_4$ and $D_2$, $D_2$ is filled in the hollow 95 and the polysilicon film 92 contains D.

A Pt electrode 93 is formed on the polysilicon film 92 just above the hollow 95. A $D_2$/Pt-based excess heat can be detected by applying a negative voltage to the Pt electrode 93 relative to the silicon substrate 90.

The device of this embodiment is minute in structure and excellent in hermetic seal, and is rarely affected by external impurities. Therefore, an excess heat can be measured reliably.

In the above embodiments, a native oxide film is used for passing etchant gas through it when a hollow is formed. Any film other than the native oxide film may also be used if it is scarcely etched and has holes through which etchant gas can pass. Etching in a vapor phase as well as in a liquid phase may be performed.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of forming a hollow comprising the steps of:
   (a) forming a film having a number of holes at least on a partial area of a surface of a substrate, said film being formed to pass an etchant therethrough;
   (b) etching said substrate by said etchant through the holes in at least a partial region of said film to form a hollow under at least said partial region of said film; and
   (c) forming an upper layer at least on said film by film deposition to cover and close the holes and seal the hollow, wherein said upper layer does not contact a bottom surface of said hollow.

2. A method according to claim 1, wherein said substrate is a silicon substrate, and said film is a native oxide film.

3. A method according to claim 2, further comprising before said step (a) the steps of:
   (d) forming an underlying film having a thickness on the surface of said silicon substrate; and
   (e) forming an opening in said underlying film at a region corresponding to at least said partial region to expose the surface of said silicon substrate,
   wherein said step (a) forms said native oxide film on the surface of said silicon substrate exposed at the bottom of said opening.

4. A method according to claim 3, wherein said step (b) uses chlorine-containing etchant, and said underlying film is made of material not etched by the chlorine-containing etchant.

5. A method according to claim 3, wherein said underlying film is a polysilicon film.

6. A method according to claim 3, further comprising after said step (e) the step of doping n-type impurities through said opening into said silicon substrate to form a doped region having etching selectivity compared to a non-doped region.

7. A method according to claim 2, wherein said step (b) etches said silicon substrate while applying ultraviolet light to at least said partial region.

8. A method according to claim 2, wherein said step (b) etches said silicon substrate by generating plasma containing chlorine and using only neutral Active species derived from the plasma.

9. A method according to claim 2, wherein said step (b) etches said silicon substrate while applying a laser beam to at least said partial region.

10. A method according to claim 1, wherein said partial region is a stripe region having a width of 2 µm or less.

11. A method according to claim 1, wherein said partial region is a region having a shape capable of being included in a circle having a diameter of 3 µm or less.

12. A method according to claim 3, wherein at least a portion of said silicon substrate is doped with n-type impurities to such a level that a doped region has etching selectivity compared to a non-doped region.

13. A method according to claim 12, further comprising before said step (d) the step of doping n-type impurities into said silicon substrate at a region containing said partial region.

14. A method according to claim 3, wherein said silicon substrate surface is (100)-oriented silicon.

15. A method according to claim 14, wherein said hollow is of a quadrangular pyramid shape.

16. A method of forming a hollow comprising the steps of:
   (a) forming a convex region of a pattern on an underlying substrate having a surface, said convex region having a side wall generally perpendicular to the surface of said underlying substrate;
   (b) forming a side wall protection film on the side wall of said convex region;
   (c) forming a second film having a number of holes on the upper surface of said convex region, wherein said substrate surface and said side wall protection film have a higher resistance to etching by an etchant than the convex region;
   (d) removing at least a partial region of said convex region by said etchant through the holes; and (e) forming an upper film at least on said second film to cover the holes.

17. A method according to claim 16, wherein said convex region is made of polysilicon, said second film is a native oxide film, and said step (d) removes at least a partial region of said convex region by etching said convex region made of polysilicon.

18. A method according to claim 17, wherein said pattern is a stripe pattern having a width of 2 µm or less.

19. A method according to claim 17, wherein said pattern is a pattern capable of being included in a circle having a diameter of 3 µm or less.

20. A method according to claim 16, wherein said underlying substrate is a glass substrate.

21. A method of forming a hollow comprising the steps of:

forming an intermediate film on an underlying substrate;

forming an upper film on said intermediate film, said upper film having etching selectively different from said intermediate film;

selectively etching said upper film and said intermediate film at a region, wherein said underlying substrate has a higher resistance to this selective etching than said upper film and said intermediate film;

forming a third film having a number of holes on a side wall of said intermediate film at said region, said third film having etching characteristic different from said intermediate film, said holes being capable of passing an etchant therethrough and of being closed by film deposition;

etching said intermediate film by said etchant through holes of said third film to a depth; and forming a cover film at least on said third film to close the holes.

22. A method according to claim 21, wherein said intermediate film is made of polysilicon, and said third film is a native oxide film.

23. A method according to claim 21, wherein said underlying substrate is a glass substrate.

* * * * *